United States Patent
Schnetzka et al.

(10) Patent No.: US 7,876,561 B2
(45) Date of Patent: Jan. 25, 2011

(54) COOLING SYSTEMS FOR VARIABLE SPEED DRIVES AND INDUCTORS

(75) Inventors: Harold R. Schnetzka, York, PA (US); Ivan Jadric, York, PA (US); Steve Hoover, York, PA (US); Kathleen S. Rogers, Dallastown, PA (US); Mustafa Kemel Yanik, York, PA (US)

(73) Assignee: Johnson Controls Technology Company, Holland, MI (US)

( * ) Notice: Subject to any disclaimer, the term of this patent is extended or adjusted under 35 U.S.C. 154(b) by 226 days.

(21) Appl. No.: 11/932,479

(22) Filed: Oct. 31, 2007

(65) Prior Publication Data

US 2008/0174393 A1 Jul. 24, 2008

Related U.S. Application Data

(60) Provisional application No. 60/885,932, filed on Jan. 22, 2007.

(51) Int. Cl.
*H05K 7/20* (2006.01)
(52) U.S. Cl. .................. 361/699; 361/274.3; 361/676; 361/697; 361/707; 363/141; 180/297; 62/259.2
(58) Field of Classification Search .................. 361/676, 361/690, 697, 699, 274.3, 623, 707
See application file for complete search history.

(56) References Cited

U.S. PATENT DOCUMENTS

| | | | |
|---|---|---|---|
| 3,593,103 A | 7/1971 | Chandler et al. |
| 4,308,491 A | 12/1981 | Joyner, Jr. et al. |
| 4,587,474 A | 5/1986 | Espelage et al. |
| 4,628,991 A | 12/1986 | Hsiao et al. |
| 4,758,771 A | 7/1988 | Saito et al. |
| 5,005,640 A | 4/1991 | Grote et al. |
| 5,081,368 A | 1/1992 | West |
| 5,123,080 A | 6/1992 | Gillett et al. |
| 5,127,085 A | 6/1992 | Becker et al. |
| 5,199,487 A | 4/1993 | DiFrancesco et al. |
| 5,203,401 A | 4/1993 | Hamburgen et al. |

(Continued)

FOREIGN PATENT DOCUMENTS

DE 33 29 325 A 3/1984

(Continued)

OTHER PUBLICATIONS

Annabelle Van Zyl, Rene Spee, Alex Faveluke, and Shibashis Bhowmik; Voltange Sag Ride-Through for Adjustable-Speed Drives With Active Recitifiers; Nov./Dec. 1998; vol. 34, Issue No. 6; IEEE Transactions on Industry Applications.

(Continued)

*Primary Examiner*—Jayprakash N Gandhi
*Assistant Examiner*—Courtney Smith
(74) *Attorney, Agent, or Firm*—McNees Wallace & Nurick LLC

(57) ABSTRACT

A plastic liquid cooled variable speed drive or inductor provided. The cooler provides lightweight, space conservative, corrosive free cooling to the components as well as provides a mounting area for modules. A cooler can be mounted to the core of an inductor to absorb heat generated by the core losses.

10 Claims, 8 Drawing Sheets

U.S. PATENT DOCUMENTS

| | | | |
|---|---|---|---|
| 5,293,070 A | 3/1994 | Burgess et al. | |
| 5,298,848 A | 3/1994 | Ueda et al. | |
| 5,316,075 A | 5/1994 | Quon et al. | |
| 5,317,805 A | 6/1994 | Hoopman et al. | |
| 5,410,230 A | 4/1995 | Bessler et al. | |
| 5,463,528 A | 10/1995 | Umezawa | |
| 5,539,617 A | 7/1996 | Bochtler | |
| 5,592,058 A | 1/1997 | Archer et al. | |
| 5,631,821 A | 5/1997 | Muso | |
| 5,646,458 A | 7/1997 | Bowyer et al. | |
| 5,675,473 A | 10/1997 | McDunn et al. | |
| 5,747,955 A | 5/1998 | Rotunda et al. | |
| 5,796,234 A | 8/1998 | Vrionis | |
| 5,869,946 A | 2/1999 | Carobolante | |
| 5,936,855 A | 8/1999 | Salmon | |
| 5,969,966 A | 10/1999 | Sawa et al. | |
| 6,005,362 A | 12/1999 | Enjeti et al. | |
| 6,031,751 A | 2/2000 | Janko | |
| 6,034,872 A | 3/2000 | Chrysler et al. | |
| 6,072,302 A | 6/2000 | Underwood et al. | |
| 6,118,676 A | 9/2000 | Divan et al. | |
| 6,124,632 A | 9/2000 | Lo et al. | |
| 6,160,722 A | 12/2000 | Thommes et al. | |
| 6,166,937 A | 12/2000 | Yamamura et al. | |
| 6,213,195 B1 | 4/2001 | Sutrina et al. | |
| 6,239,513 B1 | 5/2001 | Dean et al. | |
| 6,257,320 B1 | 7/2001 | Wargo | |
| 6,276,148 B1 | 8/2001 | Shaw | |
| 6,313,600 B1 | 11/2001 | Hammond et al. | |
| 6,348,775 B1 | 2/2002 | Edelson et al. | |
| 6,434,003 B1* | 8/2002 | Roy et al. | 361/699 |
| 6,457,542 B1* | 10/2002 | Hosono et al. | 180/68.1 |
| 6,487,096 B1 | 11/2002 | Gilbreth et al. | |
| 6,559,562 B1 | 5/2003 | Rostron | |
| 6,686,718 B2 | 2/2004 | Jadric et al. | |
| 6,768,284 B2 | 7/2004 | Lee et al. | |
| 6,801,019 B2 | 10/2004 | Haydock et al. | |
| 6,867,970 B2* | 3/2005 | Muller et al. | 361/695 |
| 6,961,244 B2* | 11/2005 | Tsuchiya et al. | 361/710 |
| 7,025,607 B1* | 4/2006 | Das et al. | 439/91 |
| 7,031,161 B2* | 4/2006 | Miettinen et al. | 361/704 |
| 7,081,734 B1 | 7/2006 | Jadric et al. | |
| 7,212,406 B2* | 5/2007 | Kaishian et al. | 361/699 |
| 7,289,329 B2* | 10/2007 | Chen et al. | 361/707 |
| 7,511,942 B2* | 3/2009 | Thrap | 361/502 |
| 7,522,403 B1* | 4/2009 | Rinehart et al. | 361/303 |
| 2003/0015873 A1 | 1/2003 | Khalizadeh et al. | |
| 2003/0052544 A1 | 3/2003 | Yamamoto et al. | |
| 2003/0133267 A1 | 7/2003 | Beihoff et al. | |
| 2005/0052848 A1 | 3/2005 | Hamman | |
| 2005/0057210 A1 | 3/2005 | Ueda et al. | |
| 2005/0068001 A1 | 3/2005 | Skaug et al. | |
| 2005/0162875 A1* | 7/2005 | Rodriguez et al. | 363/68 |
| 2006/0209512 A1 | 9/2006 | Taniguchi et al. | |
| 2007/0063668 A1 | 3/2007 | Schnetzke et al. | |
| 2007/0253164 A1* | 11/2007 | Matsuo et al. | 361/699 |
| 2008/0310109 A1* | 12/2008 | Park et al. | 361/697 |
| 2009/0141419 A1* | 6/2009 | Pal et al. | 361/274.3 |

FOREIGN PATENT DOCUMENTS

| | | |
|---|---|---|
| DE | 37 44 353 C | 4/1989 |
| EP | 0272776 A2 | 6/1988 |
| EP | 0283954 A2 | 9/1988 |
| EP | 0422221 A1 | 11/1989 |
| EP | 0603860 A | 6/1994 |
| EP | 0734198 A2 | 9/1996 |
| EP | 1300937 A2 | 4/2003 |
| EP | 1770774 A2 | 4/2007 |
| EP | 0313366 A2 | 8/2008 |
| FR | 2 355 266 | 1/1977 |
| FR | 2715773 A1 | 8/1995 |
| JP | 60-037756 | 2/1985 |
| JP | 62-142021 | 6/1987 |
| JP | 06105563 | 9/1992 |
| JP | 05068376 | 3/1993 |
| JP | 5-327257 A | 12/1993 |
| JP | 5-335769 A | 12/1993 |
| JP | 7-335798 A | 12/1995 |
| JP | 8-167529 A | 6/1996 |
| JP | 11-346480 A | 12/1999 |
| JP | 2000-058746 A | 2/2000 |
| JP | 2000-323635 A | 11/2000 |
| JP | 2001-126948 A | 5/2001 |
| JP | 2002176767 | 6/2002 |
| JP | 04026374 | 9/2006 |
| WO | 9314559 A1 | 7/1993 |
| WO | 9732168 A1 | 9/1997 |

OTHER PUBLICATIONS

Annette Von Jouanne, Prasad N. Enjeti, and Basudeb Banerjee; Assessment of Ride-Through Alternatives for Adjustable-Speed Drives; Jul./Aug. 1999; vol. 35, Issue No. 4; IEEE Transactions on Industry Applications.

Johnson Controls, Inc., Variable Speed Drives Power Up, article, 2008, Johnson Controls, Inc., Milwaukee, WI, USA.

IBM Corp.; Water Impingement Test Cold Plate; IBM Technical Disclosure Bulletin; Nov. 1, 1991; vol. 34, No. 6, pp. 220-221.

* cited by examiner

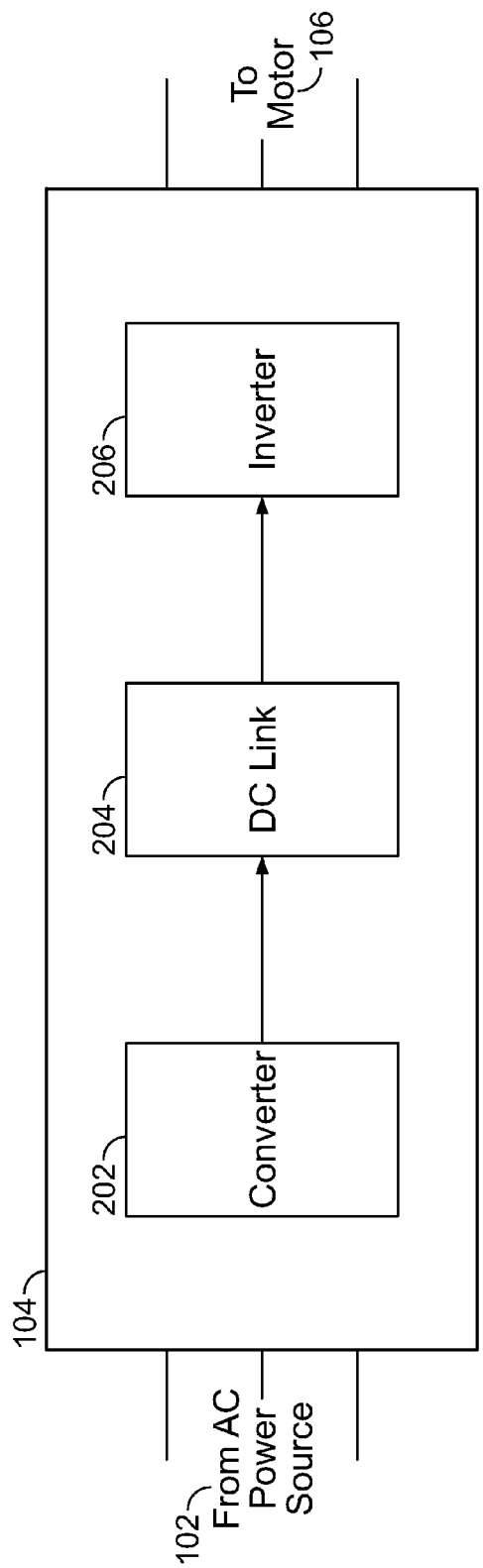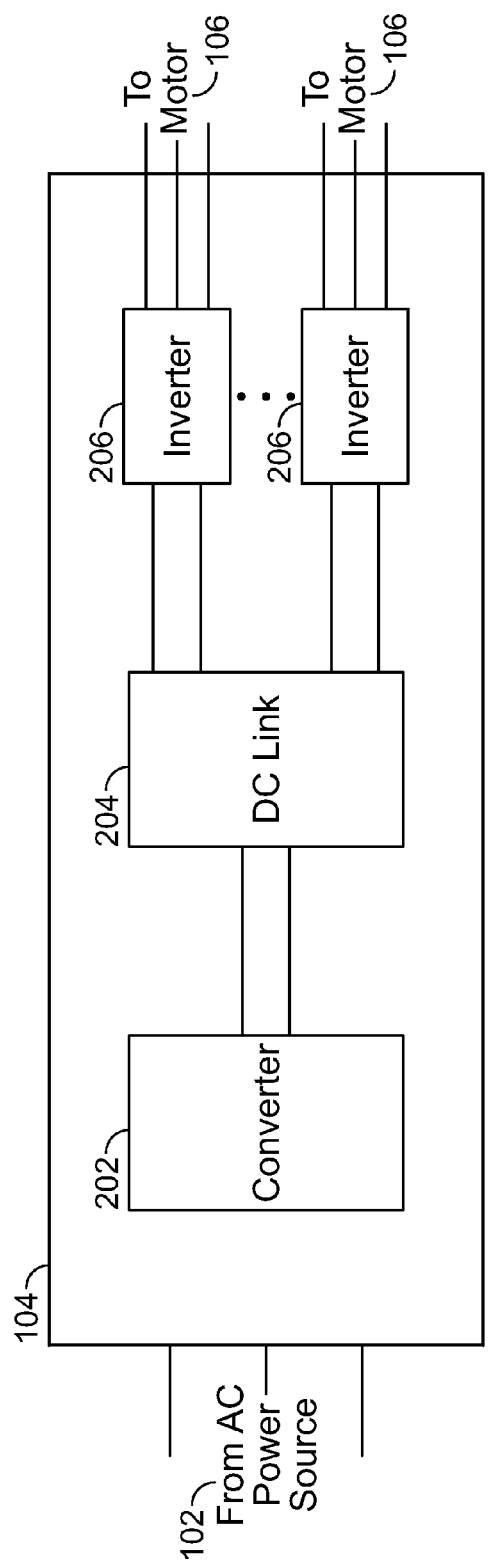

US 7,876,561 B2

COOLING SYSTEMS FOR VARIABLE SPEED DRIVES AND INDUCTORS

CROSS REFERENCE TO RELATED PATENT APPLICATIONS

This application claims the benefit of U.S. Provisional Application No. 60/885,932, filed Jan. 22, 2007.

BACKGROUND

The application relates generally to cooling electronic components. The application relates more specifically to cooling systems for variable speed drives and inductors.

A variable speed drive (VSD) for heating, ventilation, air-conditioning and refrigeration (HVAC&R) applications can include a rectifier or converter, a DC link and an inverter. Variable speed drives with current source inverter technology often utilize liquid cooled inductors. Medium voltage variable speed drives may also utilize liquid cooled inductors.

When a liquid cooled coil inductor is used, the coil conductors can be copper tubes that have been compressed to an oval shape. Coolant is circulated directly through the inductor tubing, requiring the use of de-ionized water to avoid plating out the copper into the cooling medium. A de-ionized cooling loop allows for good electrical insulation between the various electric components requiring cooling as the coolant is in contact with the inductor tubing as well as various other components that are a part of the cooling system.

In addition to the issues discussed above relating to VSDs and inductors, in the past, power assembly designs were bulky and heavy. They utilized aluminum electrolytic capacitors which have an inherent wear-out mechanism associated with the use of a liquid electrolyte and a seal. The aluminum electrolytic capacitors are physically heavy and are difficult to mount due to their cylindrical shape. The heatsinks were composed of either copper or aluminum material. Aluminum raises corrosion concerns when used in a closed loop uninhibited cooling system where copper components are also in contact with the cooling fluid. Even when inhibited fluid is used, it has a known lifetime and requires periodic and regular maintenance. Due to their significant weight, these power assembly designs have shown weaknesses in the area of wire-bond failure within the insulated gate bipolar transistor (IGBT) module as a result of vibration. This weakness is also prevalent as a result of power/thermal cycling due to the variation in temperature between the heatsink, which mounts the IGBT module, and the laminated busbar, which electrically connects the IGBT modules together. The power assembly typically requires a metallic frame into which capacitors are inserted. IGBT power modules are typically mounted onto a heatsink and the heatsink is typically attached to the metal frame. Finally, a laminated busbar assembly is often placed on the top of the assembly and screws and clamps are used to hold the assembly together as a subassembly, which added to the bulk and weight of the designs.

Intended advantages of the disclosed systems and/or methods satisfy one or more of these needs or provides other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment includes a plastic cooling system for cooling electronic components having a base, a cooling well formed in the top of the base and open at the top, a feed channel formed in the base for accepting a cooling fluid to be introduced to the cooling well, a drain channel formed in the base through which the cooling fluid is to be carried away from the cooling well, a cooling well inlet formed in the cooling well and in communication with the feed channel, and a cooling well outlet formed in the cooling well opposite the cooling well inlet and in communication with the drain channel. The feed channel is sufficiently large relative to the size and flow characteristics of the well and cooling well inlets and outlets such that when the cooling fluid flows through the cooling device, the pressure drop across the feed channel is substantially less than the pressure drop across the well.

Another embodiment includes a plastic cooling system for a variable speed drive system having a VSD system with a converter stage connected to an AC power source providing the input AC voltage, a DC link connected to the converter stage, and an inverter stage connected to the DC link. The plastic cooling system also includes a coolant system for cooling components in the variable speed drive system. The coolant system includes a plastic cooler configured to receive a plurality of fasteners for engaging and securing an electronic component.

Yet another embodiment includes a plastic cooling system for an inductor having an inductor with a core and a coil. The cooling system also has a heat sink in thermal communication with the core. The liquid flow in the heat sink in the cooling system absorbs heat generated by the core and coil losses.

Certain advantages of the embodiments described herein are the reduced size, weight and cost of the inductor and that the coils of the inductor are also cooled conduction of the heat to the core.

Alternative exemplary embodiments relate to other features and combinations of features as may be generally recited in the claims.

BRIEF DESCRIPTION OF THE FIGURES

FIGS. 2A and 2B are schematic diagrams of embodiments of variable speed drives.

DETAILED DESCRIPTION OF THE EXEMPLARY EMBODIMENTS

Figure 1A:
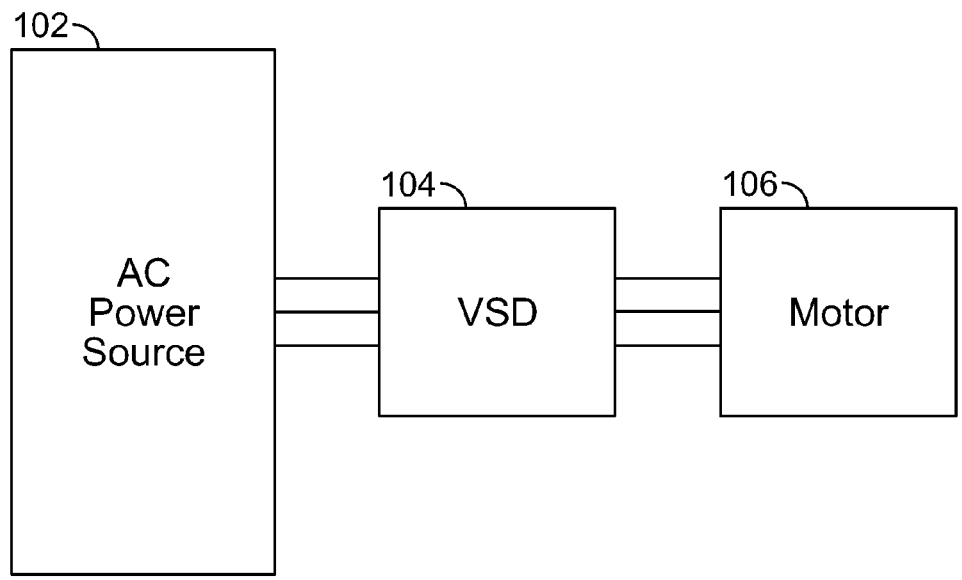
FIGS. 1A and 1B are schematic diagrams of embodiments of general system configurations.
Figure 1B:
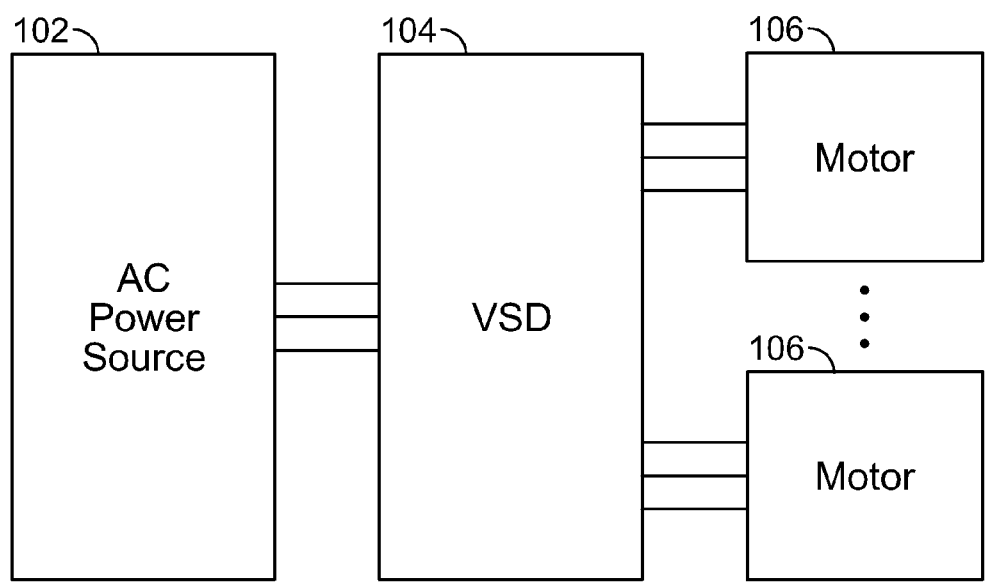

FIGS. 1A and 1B illustrate generally system configurations. An AC power source 102 supplies a variable speed drive (VSD) 104, which powers a motor 106 (see FIG. 1A) or motors 106 (see FIG. 1B). The motor(s) 106 can be used to drive a corresponding compressor of a refrigeration or chiller system (see generally, FIG. 3). The AC power source 102 provides single phase or multi-phase (e.g., three phase), fixed voltage, and fixed frequency alternating current (AC) power to the VSD 104 from an AC power grid or distribution system that is present at a site. The AC power source 102 preferably can supply an AC voltage or line voltage of 200 volts (V), 230 V, 380 V, 460 V, or 600 V, at a line frequency of 50 hertz (Hz) or 60 Hz, to the VSD 104 depending on the corresponding AC power grid.

The VSD 104 receives AC power having a particular fixed line voltage and fixed line frequency from the AC power source 102 and provides AC power to the motor(s) 106 at a desired voltage and desired frequency, both of which can be varied to satisfy particular requirements. Preferably, the VSD 104 can provide AC power to the motor(s) 106 having higher voltages and frequencies and lower voltages and frequencies than the rated voltage and frequency of the motor(s) 106. In another embodiment, the VSD 104 may again provide higher and lower frequencies but only the same or lower voltages than the rated voltage and frequency of the motor(s) 106. The motor(s) 106 can be an induction motor, but can also include any type of motor that is capable of being operated at variable speeds. The induction motor can have any suitable pole arrangement including two poles, four poles or six poles.

FIGS. 2A and 2B illustrate different embodiments of the VSD 104. The VSD 104 can have three stages: a converter stage 202, a DC link stage 204 and an output stage having one inverter 206 (see FIG. 2A) or a plurality of inverters 206 (see FIG. 2B). The converter 202 converts the fixed line frequency, fixed line voltage AC power from the AC power source 102 into direct current (DC) power. The DC link 204 filters the DC power from the converter 202 and provides energy storage components. The DC link 204 can be composed of capacitors and inductors, which are passive devices that exhibit high reliability rates and very low failure rates. Finally, in the embodiment of FIG. 2A, the inverter 206 converts the DC power from the DC link 204 into variable frequency, variable voltage AC power for the motor 106 and, in the embodiment of FIG. 2B, the inverters 206 are connected in parallel on the DC link 204 and each inverter 206 converts the DC power from the DC link 204 into a variable frequency, variable voltage AC power for a corresponding motor 106. The inverter(s) 206 can be a power module that can include power transistors, insulated gate bipolar transistor (IGBT) power switches and inverse diodes interconnected with wire bond technology. Furthermore, it is to be understood that the DC link 204 and the inverter(s) 206 of the VSD 104 can incorporate different components from those discussed above so long as the DC link 204 and inverter(s) 206 of the VSD 104 can provide the motors 106 with appropriate output voltages and frequencies.

With regard to FIGS. 1B and 2B, the inverters 206 are jointly controlled by a control system such that each inverter 206 provides AC power at the same desired voltage and frequency to corresponding motors based on a common control signal or control instruction provided to each of the inverters 206. In another embodiment, the inverters 206 are individually controlled by a control system to permit each inverter 206 to provide AC power at different desired voltages and frequencies to corresponding motors 106 based on separate control signals or control instructions provided to each inverter 206. By providing AC power at different voltages and frequencies, the inverters 206 of the VSD 104 can more effectively satisfy motor 106 and system demands and loads independent of the requirements of other motors 106 and systems connected to other inverters 206. For example, one inverter 206 can be providing full power to a motor 106, while another inverter 206 can be providing half power to another motor 106. The control of the inverters 206 in either embodiment can be by a control panel or other suitable control device.

For each motor 106 to be powered by the VSD 104, there is a corresponding inverter 206 in the output stage of the VSD 104. The number of motors 106 that can be powered by the VSD 104 is dependent upon the number of inverters 206 that are incorporated into the VSD 104. In one embodiment, there can be either 2 or 3 inverters 206 incorporated in the VSD 104 that are connected in parallel to the DC link 204 and used for powering a corresponding motor 106. While the VSD 104 can have between 2 and 3 inverters 206, it is to be understood that more than 3 inverters 206 can be used so long as the DC link 204 can provide and maintain the appropriate DC voltage to each of the inverters 206.

Figure 3:
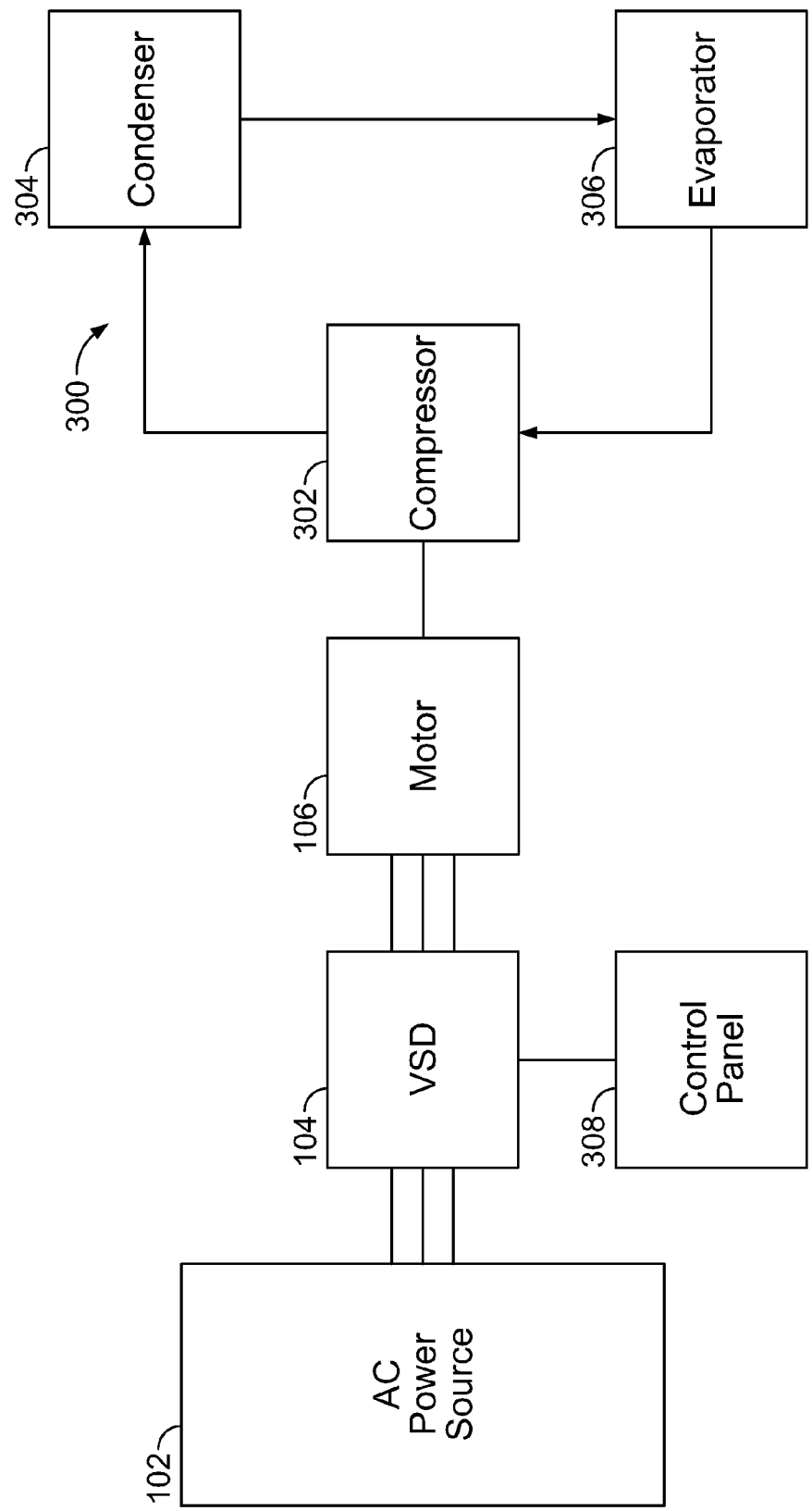
FIG. 3 is a schematic diagram of a refrigeration system.

FIG. 3 illustrates generally one embodiment of a refrigeration or chiller system using the system configuration and VSD 104 of FIGS. 1A and 2A. As shown in FIG. 3, the HVAC, refrigeration or liquid chiller system 300 includes a compressor 302, a condenser 304, a liquid chiller or evaporator 306 and a control panel 308. The compressor 302 is driven by motor 106 that is powered by VSD 104. The VSD 104 receives AC power having a particular fixed line voltage and fixed line frequency from AC power source 102 and provides AC power to the motor 106 at desired voltages and desired frequencies, both of which can be varied to satisfy particular requirements. The control panel 308 can include a variety of different components such as an analog to digital (A/D) converter, a microprocessor, a non-volatile memory, and an interface board, to control operation of the refrigeration system 300. The control panel 308 can also be used to control the operation of the VSD 104, and the motor 106.

Compressor 302 compresses a refrigerant vapor and delivers the vapor to the condenser 304 through a discharge line. The compressor 302 can be a screw compressor, centrifugal compressor, reciprocating compressor, scroll compressor, or other suitable type of compressor. The refrigerant vapor delivered by the compressor 302 to the condenser 304 enters into a heat exchange relationship with a fluid, e.g., air or water, and undergoes a phase change to a refrigerant liquid as a result of the heat exchange relationship with the fluid. The condensed liquid refrigerant from condenser 304 flows through an expansion device (not shown) to the evaporator 306.

The liquid refrigerant in the evaporator 306 enters into a heat exchange relationship with a fluid, e.g., air or water to lower the temperature of the fluid. The refrigerant liquid in the evaporator 306 undergoes a phase change to a refrigerant vapor as a result of the heat exchange relationship with the fluid. The vapor refrigerant in the evaporator 306 exits the evaporator 306 and returns to the compressor 302 by a suction line to complete the cycle. The evaporator 306 can include connections for a supply line and a return line of a cooling load. A secondary liquid, e.g., water, ethylene, calcium chloride brine or sodium chloride brine, travels into the evaporator 306 via return line and exits the evaporator 306 via supply line. The liquid refrigerant in the evaporator 306 enters into a heat exchange relationship with the secondary liquid to lower the temperature of the secondary liquid. It is to be understood that any suitable configuration of condenser 304 and evaporator 306 can be used in the system 300, provided that the appropriate phase change of the refrigerant in the condenser 304 and evaporator 306 is obtained.

The HVAC, refrigeration or liquid chiller system 300 can include many other features that are not shown in FIG. 3. Furthermore, while FIG. 3 illustrates the HVAC, refrigeration or liquid chiller system 300 as having one compressor connected in a single refrigerant circuit, it is to be understood that the system 300 can have multiple compressors, powered by a single VSD as shown in FIGS. 1B and 2B or multiple VSDs, see generally, the embodiment shown in FIGS. 1A and 2A, connected into each of one or more refrigerant circuits.

FIGS. 4-8 illustrates a plastic cooler 10 that directs coolant fluid onto electronic components or modules, e.g., high-speed switches (such as IGBTs) (not shown) that may be mounted on the cooler 10. The plastic cooler 10 is lighter than a copper or aluminum based heatsink and is cheaper to manufacture and assemble. The coolant fluid, circulating through the cooler may be any suitable fluid, e.g. water, glycol or refrigerant. Further, the plastic cooler 10 does not corrode like an aluminum cooler typically does over time. The plastic cooler allows the semiconductor module's baseplate to operate at a continuous use temperature of approximately 100 degrees centigrade.

To facilitate full operation of the electric components or modules, the plastic cooler 10 can be used at a continuous temperature of approximately 100 degrees centigrade and satisfy the appropriate standard from the Underwriters Laboratory for the approval of plastic material for flammability (UL746A-E). The plastic material used for the cooler 10 has a low level of liquid absorption, is physically durable with a high tensile strength and may be injection molded or machined. Because the power assemblies in which the cooler 10 can be mounted are cycled by both temperature and power, the plastic material of the cooler 10 should exhibit a low temperature coefficient of thermal expansion to avoid wire bond breakage within a semi-conductor module due to a mismatch of the coefficients of thermal expansion between the plastic cooler 10 and the copper laminated structures attached to the semi-conductor module terminals. Also, the plastic cooler 10 acts as a fastener to allow for the attachment of multiple power devices together permitting a single laminated busbar structure to be used to for electrical connections, thereby allowing for a reduction in the size and weight of the overall power assembly. The plastic material used for the plastic cooler 10 can be Noryl® (polyphenylene oxide, modified), Valox® (polybutylene terephthalate (PBJ)), or Vespel® (polymide).

Figure 4:
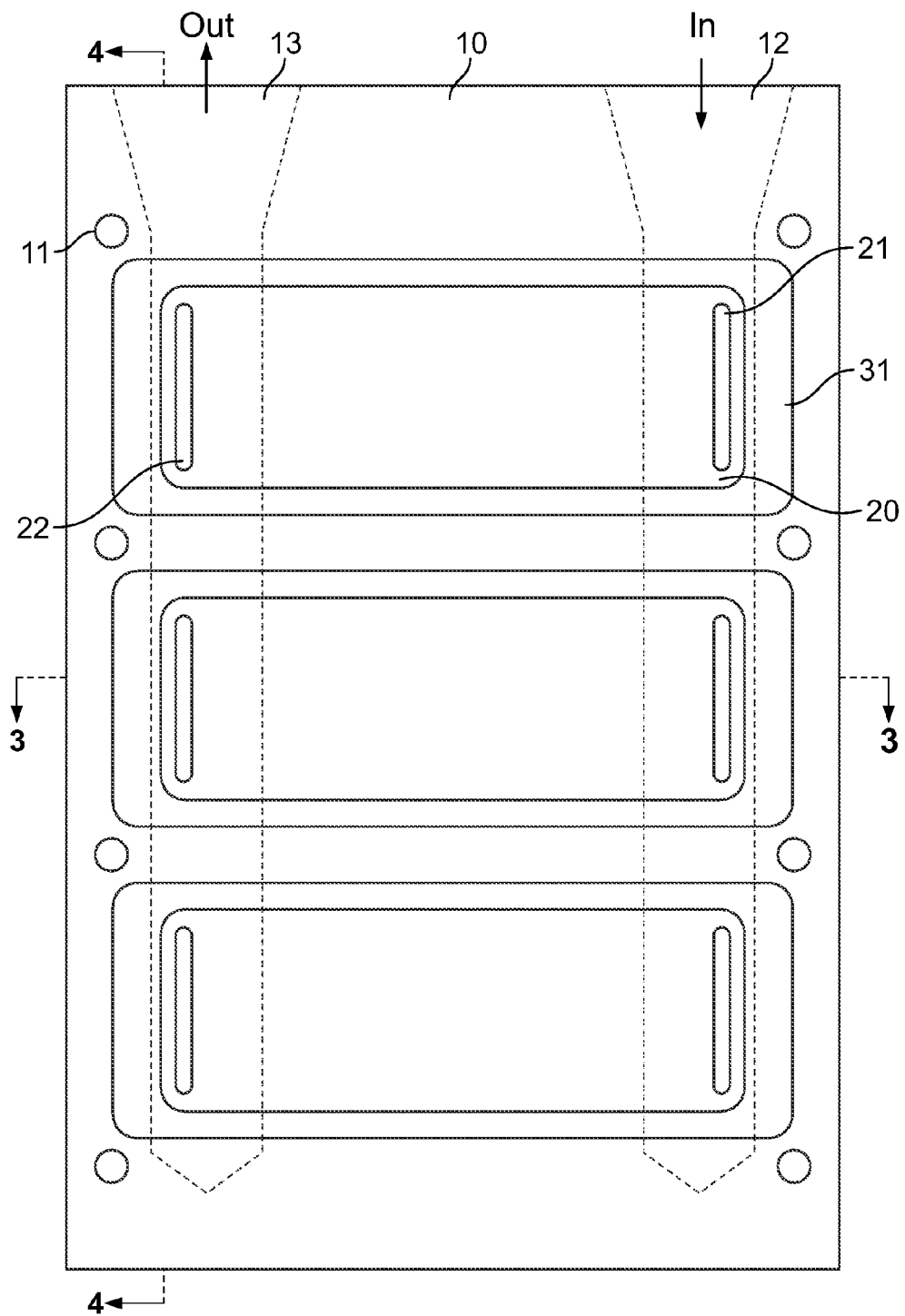
FIG. 4 is a plan view of one embodiment of a plastic cooler.
Figure 5:
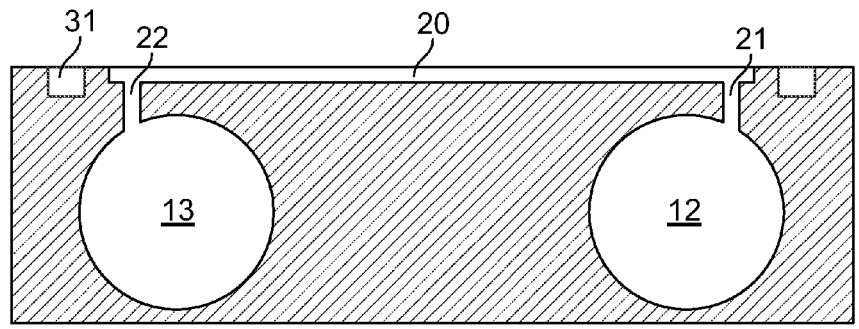
FIG. 5 is cross-sectional view of the plastic cooler taken through line 3-3 of FIG. 4.
Figure 6:
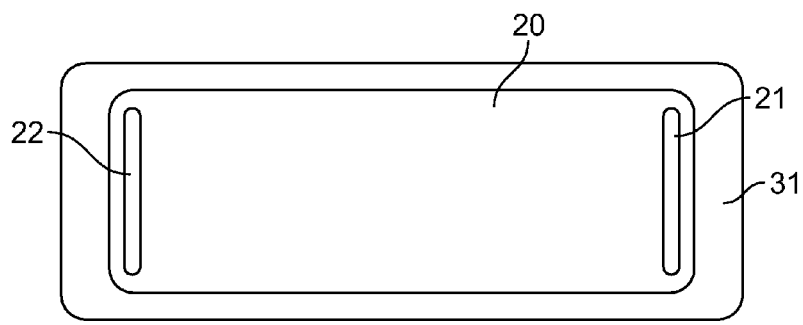
FIG. 6 is a plan view showing the well and O-ring of the plastic cooler of FIG. 4.
Figure 7:
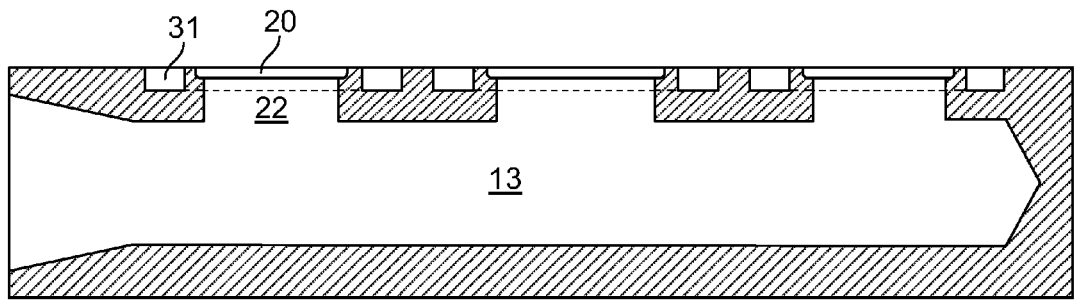
FIG. 7 is a cross-sectional view of the plastic cooler taken through line 4-4 of FIG. 4.

The plastic cooler 10 shown in FIG. 4 has mounting holes 11 that can be designed to receive screws or bolts that engage the electronic component and hold it in place. Although the plastic cooler 10 is shown using mounting holes to secure an electronic component to the base plate of the plastic cooler 10, other fastening devices or techniques, such as clamping devices, adhesives, welds, etc., could be used to fasten the electrical component to the plastic cooler 10.

Machined or otherwise formed in plastic cooler 10 are two main fluid channels 12 and 13, whereby a cooling fluid may be introduced into the cooler 10 via feed channel 12 and may exit the cooler 10 via drain channel 13. In the illustrated embodiment, these channels are relatively large, cylindrical channels that extend along the length of the plastic cooler 10. The channels are sized and designed to have a relatively low pressure drop along their lengths.

At the top of the plastic cooler 10 are found a series of concave wells 20. In one embodiment, wells 20 are surrounded by an O-ring groove 31 into which an O-ring may be placed. The electronic devices to be cooled are then positioned in place over the wells 20 and fastened via mounting holes 11, or via other devices or techniques, whereby a water-tight seal is created between the electronic component and the plastic cooler 10 via the O-ring. There can be an individual well 20 for each individual electronic component or module to be cooled, and the electronic component is positioned directly over the well 20, so that the bottom of the electronic component is placed in direct contact with the cooling fluid.

The wells 20 can have a width and length, and shape, designed to match the width, length, and shape of the electronic component to be cooled. For example, in an HVAC application where the electronic components are switches, the wells 20 can have a width of approximately 1.5 inches and a length of 3 inches. Cooling fluid enters a well 20 from feed channel 12 through an inlet port 21 formed in the well 20, flows through the well 20, and then exits out outlet port 22 and into outlet channel 13. The inlet and outlet channels 12, 13 in turn are connected to a heat exchanger for cooling the cooling fluid that exits outlet channel 13.

Plastic cooler 10 and its components provide optimum heat transfer between the cooling fluid and the electronic components, in an efficient and cost effective manner. Optimum results can be achieved with wells 20 having a depth within the range of 0.02 to 0.20 inches, coupled with a hydraulic diameter between 0.05 and 0.20 inches, and with inlets that are 90 degree nozzles, applying the cooling fluid at an angle of approximately 90 degrees against the surface of the electronic component placed over the well 20. The hydraulic diameter of the wells 20 is thus defined generally by the following equation: Hydraulic Diameter=4× Cross-sectional area/(2× Well Depth+2×Well Width). The nozzles preferably are located at the end of a well 20, as shown in the Figures, so that the cooling fluid in effect bounces off both the surface of the electronic component and the walls of the well 20 adjacent the nozzle.

The nozzles promote a high degree of turbulence due to the impingement of cooling fluid on the surface of the electronic component. This turbulence is sustained by the optimal selection of the well depth and hydraulic diameter. A shallower well depth or smaller hydraulic diameter would tend to re-laminarize the flow, thereby decreasing some of the enhancement in heat transfer. On the other hand, a deeper well depth or larger hydraulic diameter would tend to decrease the heat transfer enhancement due to a reduction in the velocity of the fluid adjacent to the surface.

The plastic cooler 10 can have a pressure drop across the length of the inlet channel 12 that is substantially less than the pressure drop across the wells. The reduced pressure drop across the inlet channel 12 is achieved by increasing the size of at least the inlet channel 12, relative to the size, shape, and flow characteristics of the well 20 and its inlets 21 and outlets 22, to achieve this relative pressure drop relationship. The pressure drop across the length of inlet channel 12 should be no greater than ¹⁄₁₀th of the pressure drop across the individual wells 20. In one embodiment, each of the wells 20 has the same size, shape, and fluid flow characteristics.

Figure 8:
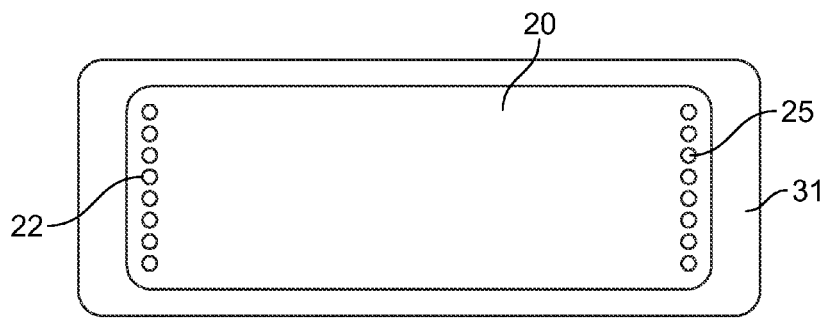
FIG. 8 is a plan view showing a second embodiment of the well and O-ring.

The inlets 21 and outlets 22 of the wells 20 are in the form of elongated slots. The slots 21 operate as nozzles that direct cooling fluid against the bottom surface of the electronic components. Inlet 21 and outlet 22 are sufficiently small in comparison to channels 12 and 13 such that no appreciable pressure drop is measurable across the channel 13 as cooling liquid flows into each of the wells 20. As shown in FIG. 8, another embodiment of the inlet 21 and outlet 22 ports is shown whereby the inlet 21 and outlet 22 are actually a plurality of openings 25 formed into either end of the well 20. The ports (See, e.g., FIG. 6) may be formed as elongated slots that extend from the bottom of the well downward to the channels 12 and 13. These slots preferably are perpendicular to the surface of the plastic cooler 10. This combination achieves a more turbulent flow that enhances the heat transfer without significantly impacting pressure drop. The uncomplicated shape of the wells, inlets and channels provides for much easier manufacturing than is associated with other related devices that have wells of varying depths or require the use of obstacles placed in the flow path to enhance the turbulent flow.

The channels 12 and 13 provide substantially equal pressure along the entire length of both channels, with the result that each well 20 "sees" the same inlet pressure and pressure differential and is capable of having an equal flow and thus an equal cooling capability. The use of channels having these characteristics minimizes, and preferably avoids, the problem of reduced flow in each subsequent well.

Also, by connecting each well 20 directly to the inlet 12 as opposed to having the cooling fluid flow in series from the first well to the last, each well 20 is fed with fresh coolant which maximizes the cooling capability of all of the wells 20.

Figure 9:
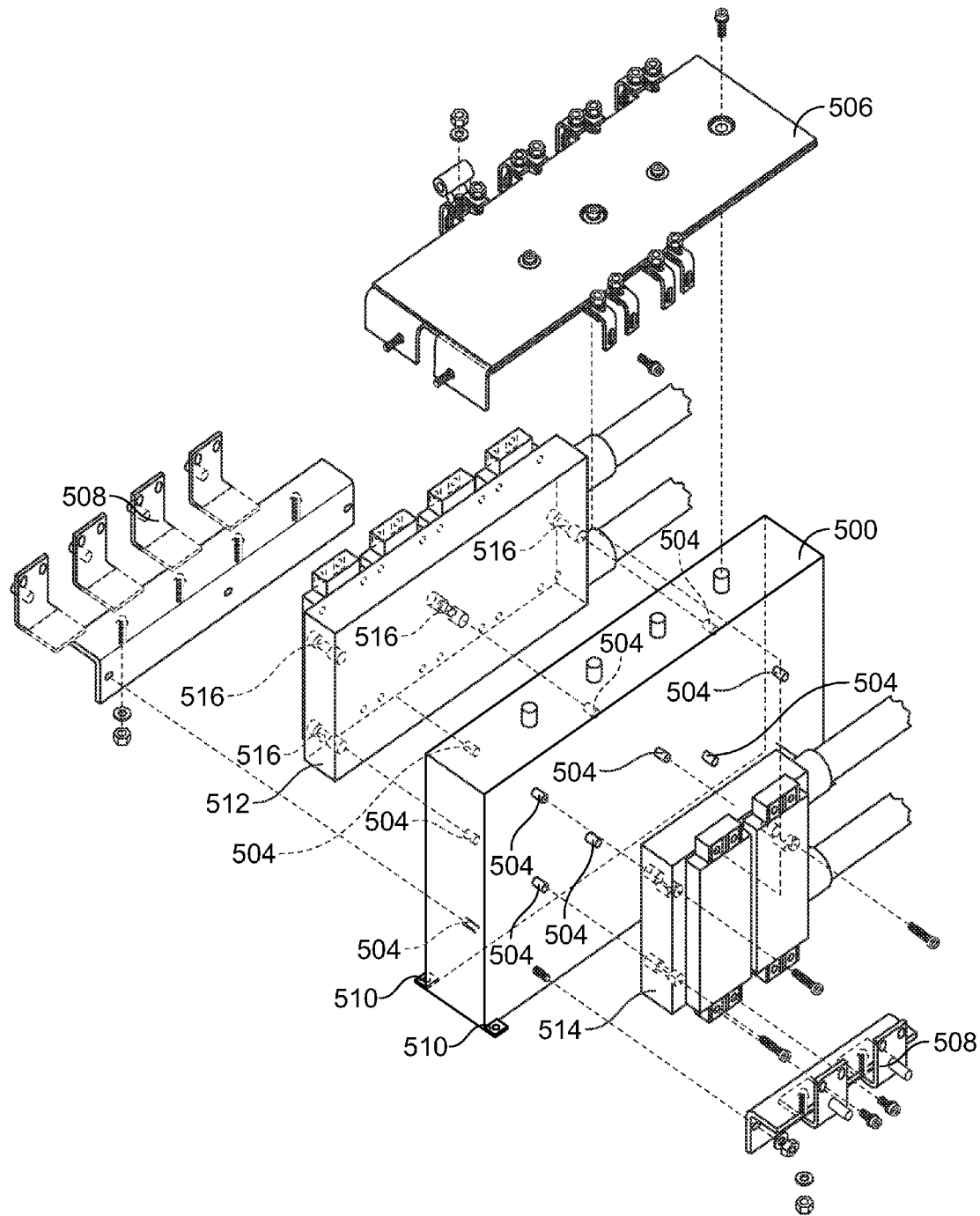
FIG. 9 is an illustration of a film capacitor, a plastic cooler and associated mounting components.

The power assembly may operate as single phase for applications that require higher power output levels, or as three phases for applications requiring lower power output levels. Referring now to FIG. 9, film capacitors 500 are used in place of traditional electrolytic capacitors. The use of a film capacitor 500 reduces the cost of manufacture, reduces the total overall weight of the assembly, reduces the overall size of the assembly, and increases the reliability of the system. The film capacitor 500 increases the reliability of the assembly by eliminating the need to evaporate electrolyte liquid present when the traditional electrolyte capacitors are used. Mounting apertures 504 are disposed on the capacitors 500 for mounting other components or subassemblies, e.g. bus plates 506, angled bus plates 508, IGBT modules 512, 514 and mounting devices for attaching the assembly in a VSD enclosure (not shown). In addition, mounting bases 510 are disposed on the film capacitor 500 to mount the entire assembly on a shelf or other suitable surface (not shown). Fasteners 516, e.g. screws or other suitable fasteners, are used to mate with the apertures 504 to secure the components to the capacitor.

In another embodiment, additional electronic components can be affixed to the plastic cooler 10 on the surface opposite the one with the wells. Additional open wells may be included on the opposite surface, and the heat from the additional power devices can be removed by the liquid coolant in the plastic cooler that is in direct contact with the bottom of the additional electronic component. Alternatively, if no cooling wells are used on the opposite surface, the electronic components can be cooled by transferring the heat through the component to the plastic cooler and then to the liquid.

Figure 10:
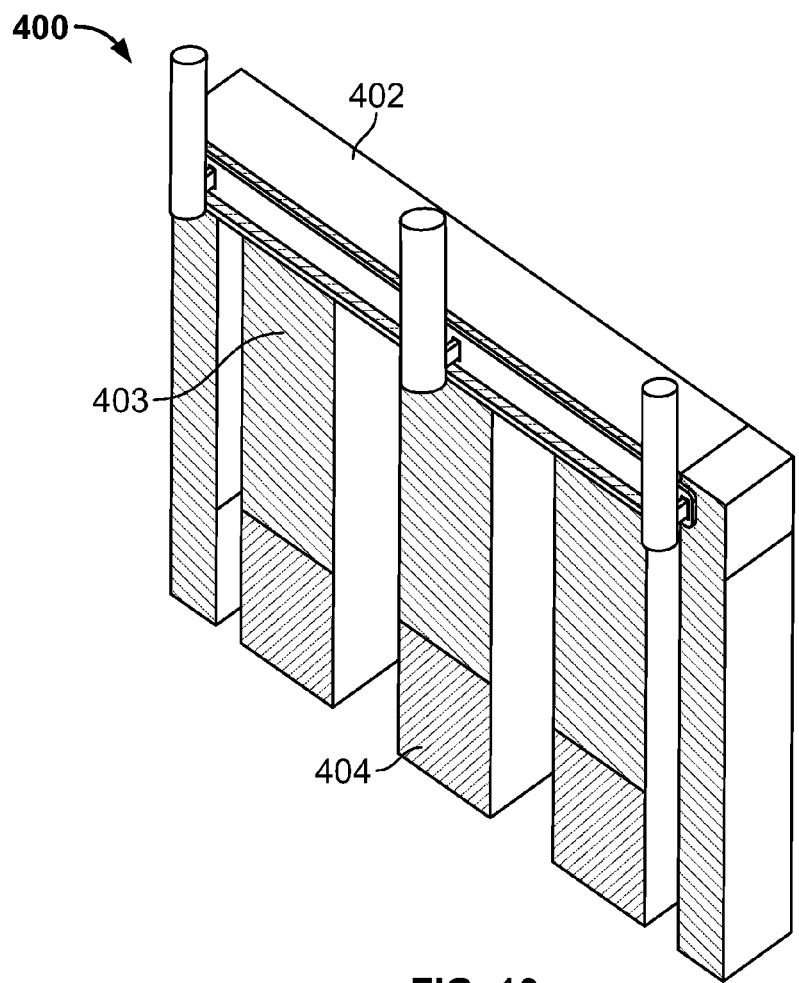
FIG. 10 is a cross-section of a five-legged core, liquid cooled inductor.

Referring now to FIG. 10, an inductor 400 includes two major subassemblies—the core 402 and the coil 403. The core 402 subassembly can be composed of a plurality of thin steel strips called laminations 404. Multiple lamination sheets 404 are stacked to form the core 402 of the inductor 400. During manufacture, silicon can be added to the steel to improve the electrical resistivity of the laminations 404. Grain orientation of the laminations 404 lowers the losses and extends the boundaries of useful operation of the core 402 material. Laminations 404 are used to minimize eddy currents and the losses associated with eddy currents, which become more of a concern as the operational frequency of the inductor 400 increases. While silicon steel laminations 404 can be used in one embodiment it should be understood that any type of suitable material may be used. For example, alternate lamination materials include, but are not limited to, nickel iron, cobalt alloys, powdered iron, ferrous alloys, molybdenum permalloy powdered iron, nickel-iron powder, ceramic ferrites, manganese zinc ferrites, nickel zinc ferrites and manganese ferrites.

Core losses are caused by hysteresis losses and eddy current losses and losses increase the operating temperature of the core 402 and reduce the efficiency of the inductor 400. The operating temperature of the core 402 has an influence on the other materials used in the inductor 400, such as insulating materials and varnishes. Each material has a maximum operating temperature, and the operating temperature of the core 402 determines the available options for insulating materials. As the operating temperature increases the number of available options for use as insulating materials is reduced, and the costs of the materials is increased. The useful life of the inductor may also be compromised as the operating temperature of the inductor is increased.

The coil 403 subassembly is composed of insulating materials and current carrying conductors. The conductors may be any suitable type of conductive material, e.g., copper and aluminum. Copper conductors have a lower resitivity but a higher cost and weight than aluminum conductors. The sheets of the conductors are typically interleaved with layers of insulating material. The insulating material may be any suitable insulating material e.g., Nomex® brand fiber (manufactured by E. I. du Pont de Nemours and Company), ceramic or woven glass fiber. Air ducts are provided between the coil layers to provide for the movement of air, either forced air or natural convection, which removes the heat generated by the losses associated with the coil. The operating temperature of the coil conductors and insulators is ultimately determined by the combination of losses and air movement.

Figure 11:
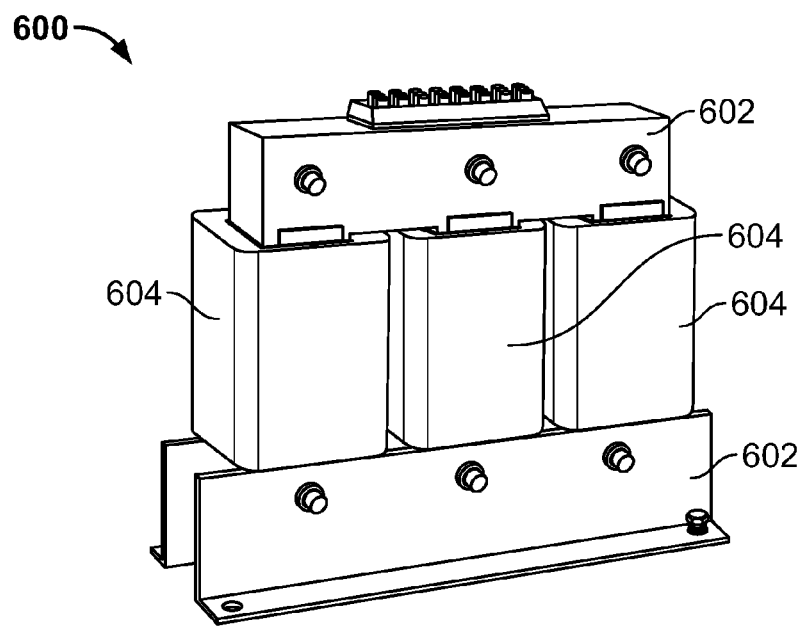
FIG. 11 is an illustration of a five-legged core, liquid-cooled inductor.

Referring to FIG. 11, the cooler (See, e.g., FIG. 4) is applied to the top surfaces of the core 602 of an inductor 600. The cooler 10 uses fluid such as water, glycol or refrigerant to cool the core 602. The fluid travels through the cooler and absorbs the heat generated by the core.

To allow for heat conduction throughout the core 602 including the core gaps, a thermally conductive, non-ferromagnetic material is used to provide a proper magnetic gap, while also allowing for heat transfer across that gap. A material such as a "Grade A Solid Boron Nitride" material manufactured by Saint Gobain Ceramics can be used, however other materials that can be used include aluminum nitride ceramics and alumina ceramics.

The coil 604 is formed by tightly interleaving layers of aluminum or copper foil with layers of an electrically insulating and thermally conductive material in order to form a low thermal impedance coil subassembly. The heat generated at the coil subassembly is transferred by heat conduction from the coil 604 to the core 602 and subsequently to a heatsink connected to the core 602 where it is absorbed by the liquid flow through the heat sink. The electrically insulating but thermally conductive sheets of material are commonly available e.g. Cho-TherM™, Therma-Gap™, Therm-Attach™ and Therma-Flow™ materials. In other embodiments, any suitable materials can be used that are compatible with the standard insulating varnishes used in conventional inductor manufacturing processes, and that also exhibit tear-through capability with maximum continuous use operating temperatures approaching 200 degrees Celsius. The coil layers are tightly wound around the core leg to provide a thermally conductive path to the core 602.

Figure 12:
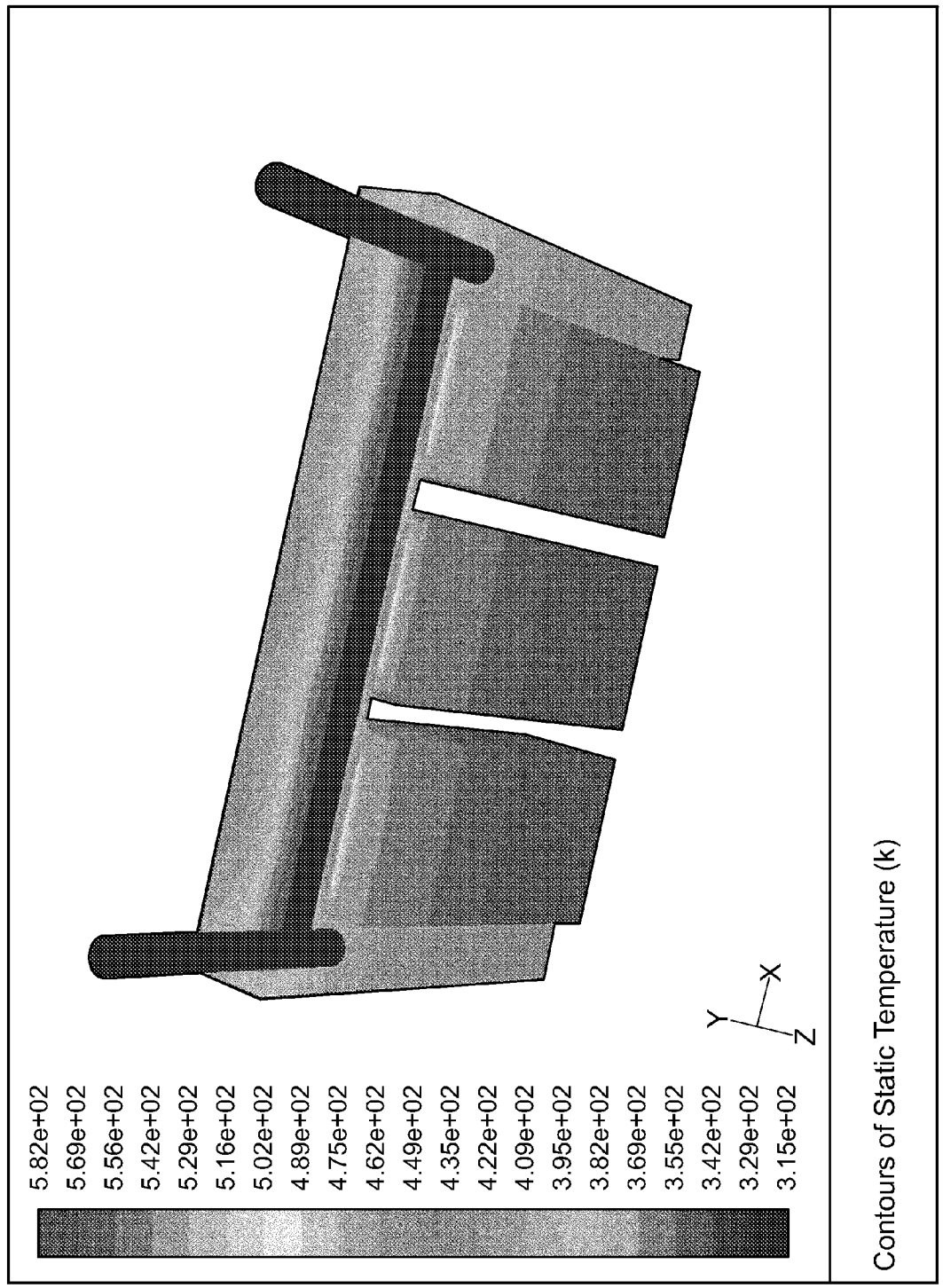
FIG. 12 is an illustration of a CFD analysis of the five-legged core, liquid-cooled inductor of FIG. 11.

FIG. 12 illustrates the results of a computer simulation intended to predict temperature distribution within the inductor 600 whose core 602 is shown in FIG. 11, by showing in shades of varying color, the thermal gradient within the inductor 600. The table below illustrates the influence of various thermally conductive, electrically insulating materials on the peak inductor temperature rise.

TABLE 1

| Winding Material | Aluminum | | | |
|---|---|---|---|---|
| Winding Thickness [in] | 0.031 | | | |
| Thermal Conductivity of Winding Material [W/m-K] | 240 | | | |
| Heat Generation per coil [W] | 1146 | | | |
| Heat Generation in the core [W] | 344 | | | |
| Number of Winding Turns | 15 | | | |
| Gap Material | Gap Pad 1500 | Gap Pad 5000S35 | Gap Pad 3000S30 | Sil Pad 2000 |
| Gap Material Thickness [in] | 0.03 | 0.02 | 0.01 | 0.01 |
| Thermal Conductivity of Gap Material [W/m-K] | 1.5 | 5 | 3 | 3.5 |
| Overall wrapped winding thickness [in] | 0.915 | 0.765 | 0.615 | 0.615 |
| Overall winding conductivity in transverse direction [W/m-K] | 3.03 | 12.35 | 11.84 | 13.73 |
| Overall winding conductivity in parallel direction [W/m-K] | 122.70 | 147.84 | 182.20 | 182.32 |
| Maximum Temperature Rise [K] | 290.4 | 233.8 | 232.4 | 229.0 |

Another embodiment includes an active converter module with an integral means to control the pre-charging of the DC link capacitors in the power assembly, for example, such a pre-charging system as described in commonly-owned U.S. patent application Ser. No. 11/073,830, which is hereby incorporated by reference.

It should be understood that the application is not limited to the details or methodology set forth in the following description or illustrated in the figures. It should also be understood that the phraseology and terminology employed herein is for the purpose of description only and should not be regarded as limiting.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the plastic cooler for the variable speed drives and inductors, as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

What is claimed is:

1. A power assembly for a variable speed drive system comprising:
    a film capacitor;
    the film capacitor is mounted on an outside surface of at least one cooling device, the at least one cooling device operating as a heat sink for the film capacitor and being configured to circulate a cooling fluid through the at least one cooling device;
    at least one electrical component mounted on the at least one cooling device, the at least one electrical component being directly cooled by the circulating cooling fluid in the at least one cooling device; and
    wherein the at least one cooling device comprises a plastic material.

2. The power assembly of claim 1 wherein the film capacitor comprises mounting fasteners to mount additional components and to mount the power assembly in an enclosure.

3. The power assembly of claim 1 wherein the plastic material is selected from the group consisting of polyphenylene oxide, modified, polybutylene terephthalate, and polymide.

4. The power assembly of claim 1 wherein the at least one cooling device operates at a continuous use temperature of approximately 100 degrees centigrade.

5. The power assembly of claim 1 wherein the fluid directed through the at least one cooling device is refrigerant, glycol or water.

6. The power assembly of claim 1 wherein the at least one cooling device is manufactured by an injection molding process or a machined process.

7. The power assembly of claim 1 wherein the plastic material exhibits a low temperature coefficient of thermal expansion.

8. The power assembly of claim 1 wherein a plurality of electronic components are mounted to the at least one cooling device.

9. The power assembly of claim 1 wherein the at least one cooling device mounted on the film capacitor is secured to the film capacitor with at least one fastener.

10. The power assembly of claim 9 wherein the at least one fastener is a screw.

* * * * *